(12) United States Patent
Bottinelli et al.

(10) Patent No.: US 10,001,530 B2
(45) Date of Patent: Jun. 19, 2018

(54) READING CIRCUIT WITH AUTOMATIC OFFSET COMPENSATION FOR A MAGNETIC-FIELD SENSOR, AND RELATED READING METHOD WITH AUTOMATIC OFFSET COMPENSATION

(75) Inventors: Fabio Bottinelli, Malnate (IT); Carlo Alberto Romani, Cornaredo (IT); Carmela Marchese, Agrate Brianza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 1347 days.

(21) Appl. No.: 13/403,897

(22) Filed: Feb. 23, 2012

(65) Prior Publication Data
US 2012/0166122 A1 Jun. 28, 2012

Related U.S. Application Data

(63) Continuation of application No. 13/228,315, filed on Sep. 8, 2011, now abandoned.

(30) Foreign Application Priority Data

Sep. 9, 2010 (IT) .............................. TO2010A0740

(51) Int. Cl.
*G01R 33/09* (2006.01)
*G01R 33/00* (2006.01)

(52) U.S. Cl.
CPC ......... *G01R 33/09* (2013.01); *G01R 33/0029* (2013.01)

(58) Field of Classification Search
CPC ........................... G01R 33/09; G01R 33/0029

USPC .......................................................... 702/85
See application file for complete search history.

(56) References Cited

U.S. PATENT DOCUMENTS

| | | | |
|---|---|---|---|
| 4,706,138 A | 11/1987 | Jove et al. | |
| 4,847,584 A | 7/1989 | Pant | |
| 5,247,278 A | 9/1993 | Pant et al. | |
| 6,566,856 B2 | 5/2003 | Sandquist et al. | |
| 7,053,607 B2 | 5/2006 | Sato | |
| 7,057,173 B2* | 6/2006 | Wright ................... | G01C 17/38 250/338.2 |
| 7,746,065 B2 | 6/2010 | Pastre et al. | |
| 2008/0054897 A1 | 3/2008 | Crolly et al. | |
| 2009/0212771 A1 | 8/2009 | Cummings et al. | |
| 2009/0224716 A1 | 9/2009 | Vig et al. | |

(Continued)

FOREIGN PATENT DOCUMENTS

| | | |
|---|---|---|
| CN | 1695066 A | 11/2005 |
| CN | 1789920 A | 6/2006 |

(Continued)

*Primary Examiner* — Janet Suglo
(74) *Attorney, Agent, or Firm* — Seed IP Law Group LLP

(57) ABSTRACT

A method reading a magnetic-field sensor provided with at least one first magnetoresistive element envisages generation of an output signal, indicative of a magnetic field, as a function of a detection signal supplied by the magnetic-field sensor. The reading method envisages: determining an offset signal present in the output signal; generating at least one compensation quantity as a function of the offset signal; and feeding back the compensation quantity at input to the reading stage so as to apply a corrective factor at input to the reading stage as a function of the compensation quantity, such as to reduce the value of the offset signal below a given threshold.

28 Claims, 5 Drawing Sheets

(56) References Cited

U.S. PATENT DOCUMENTS

| | | |
|---|---|---|
| 2010/0010288 A1 | 1/2010 | Von Ohlsen et al. |
| 2010/0166122 A1 | 7/2010 | Pahuja et al. |
| 2012/0086438 A1 | 4/2012 | Tu |
| 2012/0153936 A1 | 6/2012 | Romani et al. |
| 2012/0158324 A1 | 6/2012 | Romani et al. |

FOREIGN PATENT DOCUMENTS

| | | |
|---|---|---|
| CN | 1890576 A | 1/2007 |
| CN | 202748469 U | 2/2013 |
| WO | 2005/054887 A1 | 6/2005 |

\* cited by examiner

READING CIRCUIT WITH AUTOMATIC OFFSET COMPENSATION FOR A MAGNETIC-FIELD SENSOR, AND RELATED READING METHOD WITH AUTOMATIC OFFSET COMPENSATION

BACKGROUND

Technical Field

The present disclosure regards a reading circuit with automatic offset compensation for a magnetic-field sensor, in particular, an anisotropic magnetoresistive (AMR) magnetic sensor, and to a related reading method with automatic offset compensation.

Description of the Related Art

Magnetic-field sensors, in particular, AMR magnetic sensors, are used in a plurality of applications and systems, for example in compasses, in systems for detecting ferrous materials, in the detection of currents, and in a wide range of other applications, thanks to their capacity of detecting natural magnetic fields (for example the Earth's magnetic field) and magnetic fields generated by electrical components (such as electrical or electronic devices and lines traversed by electric current).

In a known way, the phenomenon of anisotropic magnetoresistivity occurs within particular ferrous materials, which, when subjected to an external magnetic field, undergo a variation of resistivity as a function of the characteristics of the same external magnetic field. Usually, these materials are applied as thin strips so as to form resistive elements, and the resistive elements thus formed are electrically connected to define a bridge structure (typically a Wheatstone bridge).

It is moreover known to produce AMR magnetic sensors with standard techniques of micromachining of semiconductors, as described, for example, in U.S. Pat. No. 4,847,584.

In particular, each magnetoresistive element can be formed by a film of magnetoresistive material, such as, for example, Permalloy (a ferromagnetic alloy containing iron and nickel), deposited to form a thin strip on a substrate of semiconductor material, for example silicon.

When an electric current is made to flow through a magnetoresistive element, the angle θ between the direction of magnetization of the magnetoresistive element and the direction of flow of the current affects the effective value of resistivity of the magnetoresistive element, so that, as the value of the angle θ varies, the value of electrical resistance varies (in detail, this variation follows a law of the $\cos^2\theta$ type). For example, a direction of magnetization parallel to the direction of the flow of current results in a maximum value of resistance to the passage of current through the magnetoresistive element, whereas a direction of magnetization orthogonal to the direction of the flow of current results in a minimum value of resistance to the passage of current through the magnetoresistive element.

In particular, magnetoresistive elements, ideally having the same value of resistance, are set in the Wheatstone bridge, such as to form diagonal pairs of equal elements, which react in a way opposite to one another to an external magnetic field, as shown schematically in FIG. 1 (where H designates the external magnetic field, I the electric current that flows in the magnetoresistive elements, and R the common value of resistance).

By applying a supply voltage $V_s$ at input to the bridge detection structure (in particular, to first two terminals of the bridge, which operate as input terminals), in the presence of the external magnetic field H, a variation of resistance ΔR of the magnetoresistive elements occurs, with a corresponding variation of the value of voltage drop on the magnetoresistive elements; in fact, the external magnetic field H determines a variation of the direction of magnetization of the magnetoresistive elements. There follows an unbalancing of the bridge structure, as a voltage variation ΔV at output (in particular, between the remaining two terminals of the bridge, which operate as output terminals). Since the direction of the initial magnetization of the magnetoresistive elements is known beforehand, it is hence possible to determine, for example, the direction and intensity of the external magnetic field H that acts on the AMR magnetic sensor, as a function of the voltage variation ΔV.

Usually, a reading stage (or front-end) is used, coupled to the output of the AMR magnetic sensor and including, for example, an instrumentation amplifier for detecting the unbalancing of the Wheatstone bridge and generating an output signal indicative of the characteristics of the external magnetic field to be measured.

On account of the presence of mismatch between the values of resistance at rest (i.e., in the absence of external stimuli) of the various magnetoresistive elements, due, for example, to the manufacturing process or to phenomena of non-homogeneous ageing of the components, an offset signal (i.e., a deviation with respect to the value of the useful signal) is present on the output signal of the AMR magnetic sensor; this offset is hence intrinsic to the sensor, and its value is independent of the characteristics of the external magnetic field.

In general, the voltage variation ΔV at output from the bridge can hence be considered as the sum of a useful signal $V_{sig}$, indicating the external magnetic field, and an offset $V_{off}$:

$$\Delta V = V_{sig} + V_{off}$$

In particular, even in the absence of external magnetic fields, the AMR magnetic sensor has a nonzero output signal, due precisely to the offset $V_{off}$. Given that the value of the offset is frequently comparable to, if not even higher than, the output signals due to the external magnetic field (in particular, when the sensor has to measure external magnetic fields of low value, for example the Earth's magnetic field in the case of compass applications), the presence of the offset causes errors and distortions in the measurements and moreover a reduction of the measurement scale that can be used (once the end-of-scale has been fixed). Furthermore, a possible increase of the end-of-scale of the sensor, in order to reduce the effect of the offset, disadvantageously entails a corresponding decrease in the measurement sensitivity and resolution.

Consequently, a wide range of techniques for compensation of the offset of the magnetic sensor have up to now been proposed, which are designed to reduce or at least limit the effects of the offset on the output of the sensor.

For example, a first compensation technique envisages the use of a resistor (the so-called "shunt resistor") connected in parallel to one or more of the branches of the Wheatstone bridge (and hence to one or more of the corresponding magnetoresistive elements), the value of which is such as to balance the Wheatstone bridge and thus eliminate the offset at output from the sensor. The disadvantage of this compensation technique is due to the fact that, in order to determine the value of the shunt resistor, it is necessary to remove any external magnetic field (including the contribution due to the Earth's magnetic field), and it is hence necessary to provide a perfectly shielded environment, or, alternatively, a set of Helmholtz coils. This leads to an increase in the production costs and it is difficult to implement at a mass-production level.

A different offset-compensation technique envisages the use of coils integrated in the AMR magnetic sensors, the so-called "offset straps", which are designed to generate, when flowed by a current of appropriate value, a magnetic field in the direction of detection. The value of the magnetic field generated is such as to balance the Wheatstone bridge, so that the sensor, feeling both the external magnetic field and the magnetic field generated internally by the offset straps, supplies an output signal without the offset contribution (the offset is intrinsically compensated within the AMR magnetic sensor).

This technique has the disadvantage of involving considerable power consumption (also due to the fact that frequently the offset is greater than the signals to be detected), because of the current circulating in the offset straps during operation of the sensor. In addition, this technique requires a controlled environment, in which to measure, during a calibration step, the contribution of the offset in the absence of external magnetic fields, so as to adjust accordingly the value of current that is to flow through the offset straps and the value of the compensation magnetic field to be generated internally.

A further proposed technique envisages the use of means for orientation of the direction of magnetization of the magnetoresistive elements belonging to the AMR magnetic sensors. In particular, these orientation means comprise coils or "straps", integrated in the AMR magnetic sensors, which are designed to generate, when flowed by current, a magnetic field with predefined direction and orientation; these coils are known as "set/reset straps".

For example, the set/reset straps are provided on the same substrate on which the magnetoresistive elements of the sensor are provided, being electrically insulated from, and set in the proximity of, the same magnetoresistive elements.

In use, the orientation of the direction of magnetization is obtained by applying to the magnetoresistive elements, via the set/reset straps, an intense magnetic field for a short period of time, having a value such as to force and align the orientation of the magnetic dipoles of the magnetoresistive elements in a first predefined direction ("set" pulse), or else in a second predefined direction, opposite to the first direction ("reset" pulse), according to the direction of the magnetic field generated (and hence in a way coherent with the direction of the current circulating in the set/reset straps). The aforementioned set and reset operations are known and described in detail, for example, in U.S. Pat. No. 5,247,278.

Reversal of the orientation of the magnetic dipoles causes inversion of the signal at output from the Wheatstone bridge, in the presence of an external magnetic field. Instead, the offset signal superimposed on the useful signal in the output signal does not invert its own polarity, since it is due exclusively to mismatches between the components internal to the sensor and is hence independent of the characteristics of the external magnetic field.

Consequently, the offset-compensation procedure envisages in this case application of a set pulse and, after waiting an appropriate relaxation time such as to eliminate possible current tails and allow settling of the magnetic dipoles of the ferromagnetic material, acquisition of a first sample of the output signal (for example, a voltage signal, Vout) in the presence of the external magnetic field H; the first sample of the output signal, designated by $Vout_{set}$ is given by $$Vout_{set} = H \cdot S + Vout_{off}$$

where S is the sensitivity of the AMR magnetic sensor and $Vout_{off}$ is the offset signal superimposed on the output.

Next, a reset pulse is applied and, after waiting an appropriate relaxation time such as to eliminate possible current tails and allow settling of the magnetic dipoles of the ferromagnetic material, a second sample of the output signal is acquired to obtain $$Vout_{reset} = H \cdot (-S) + Vout_{off}$$

where −S is the value of sensitivity of the AMR magnetic sensor, having in this case a value equal and opposite to the value of sensitivity S during the set operation, on account of the reversal of the sense of the magnetic dipoles of the magnetoresistive elements of the sensor.

A subtraction between the first sample and the second sample acquired is then carried out, from which it is possible to derive the useful signal, thus cancelling out the effects of the offset contribution on the output signal:

$$(Vout_{set} - Vout_{reset}) = H \cdot S + Vout_{off} - (H \cdot (-S) + Vout_{off}) = 2H \cdot S$$

This technique (known as "subtraction method") hence envisages digital cancelling-out of the offset during digital processing of the output signals (carried out by an external electronic unit, which receives the output signals from the reading stage coupled to the sensor); by processing of the output signals, the value of the useful signal is obtained, discriminating it from the offset signal $Vout_{off}$. However, the offset is in any case present at output from the AMR magnetic sensor and at input to the corresponding reading stage during the compensation procedure. In some cases, the value of the offset can be such as to saturate the reading chain. In this case, due to saturation, the reading stage supplies at output an erroneous sample, and consequently the compensation operation carried out may prove erroneous.

It follows that the various offset-compensation techniques that have so far been proposed each suffer from respective drawbacks that do not enable full exploitation of their specific advantages.

BRIEF SUMMARY

One embodiment of the present disclosure provides a technique for compensation of the offset present at output from an AMR magnetic sensor that will be free from the disadvantages of the known art, highlighted previously.

According to the present disclosure, a reading circuit and a reading method are provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
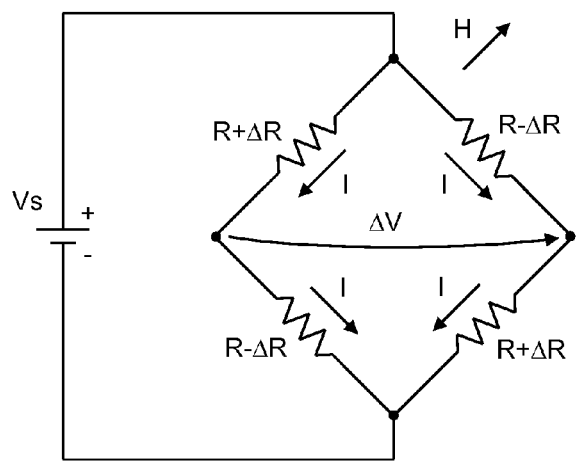
FIG. 1 shows a simplified circuit diagram of an AMR magnetic sensor of a known type, in a Wheatstone-bridge configuration.

One aspect of the present disclosure applies to an AMR magnetic sensor of the type described with reference to FIG. 1, and envisages use of a set/reset strap integrated (in a known manner) in the AMR magnetic sensor, and supply, in successive times, of a set pulse and a reset pulse, for acquiring a first sample and a second sample of the output signal from the Wheatstone bridge, $Vout_{set}$ and $Vout_{reset}$ (see, in this regard, the previous discussion).

The present applicant has found that, starting from the aforesaid first and second samples of the output signal, $Vout_{set}$ and $Vout_{reset}$, it is possible to derive not only the value of the useful signal associated to the external magnetic field H, but also the value of the offset signal $Vout_{off}$ due to the offset present in the AMR magnetic sensor. In fact, by computing a sum of the two aforesaid samples, we obtain:

$$(Vout_{set}+Vout_{reset})=H\cdot S+Vout_{off}+(H\cdot(-S)+Vout_{off})=2\cdot Vout_{off}$$

Consequently, the offset signal can be obtained by applying the following expression:

$$Vout_{off}=(Vout_{set}+Vout_{reset})/2$$

namely, it is equal to the half-sum of the two samples of the output signal acquired following upon a set pulse and a reset pulse, respectively.

In particular, according to one aspect of the present disclosure, the information on the value of the offset signal $Vout_{off}$ thus obtained is used for compensating the effect of the offset directly at output from the AMR magnetic sensor and hence at input to the reading stage associated with the sensor, thus preventing saturation of the same reading stage. In other words, as a function of the aforesaid value of the offset signal $Vout_{off}$, the value of an appropriate compensation quantity that is applied at input to the reading stage is determined and is appropriately combined with the output signal of the AMR magnetic sensor in such a way as to compensate the offset thereof.

Figure 2:
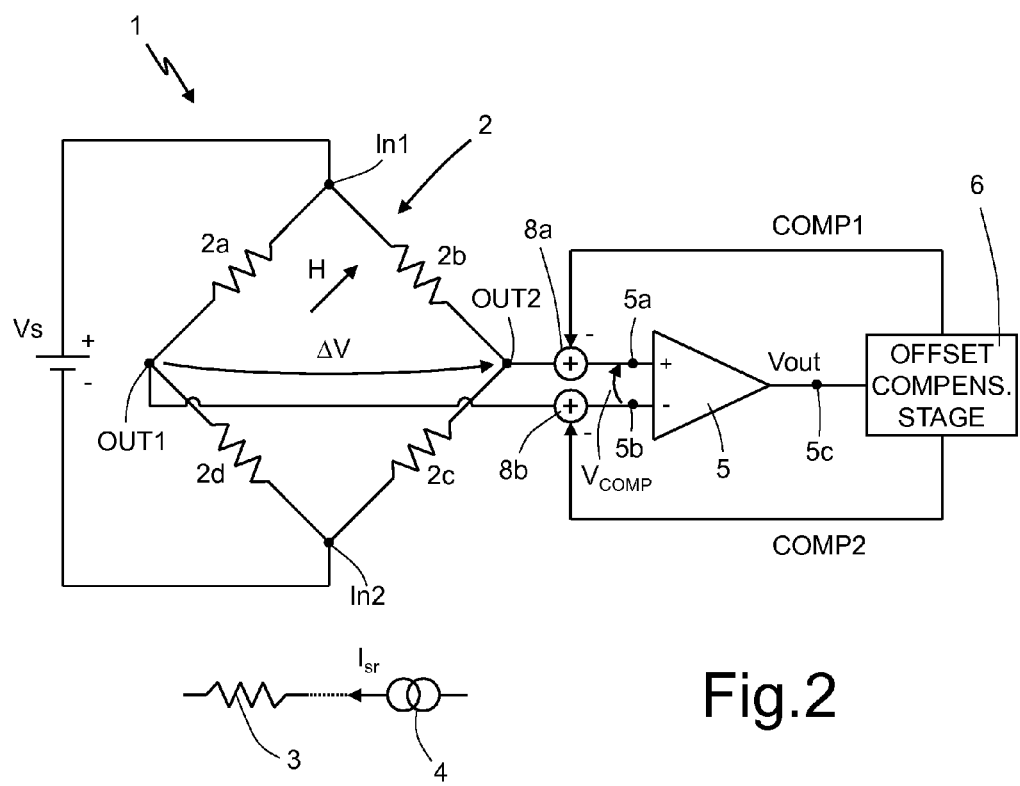
FIG. 2 shows a block diagram of a reading circuit for an AMR magnetic sensor, according to one embodiment of the present disclosure.

FIG. 2 is a schematic illustration of the reading circuit according to one embodiment of the present disclosure, designated as a whole by 1, associated with an AMR magnetic sensor, designated by 2 and shown schematically by means of its Wheatstone-bridge equivalent circuit.

In particular, the AMR magnetic sensor 2 comprises four magnetoresistive elements 2a-2d, for example constituted by strips of a thin film of magnetoresistive material, such as Permalloy, which are designed to have one and the same value of resistance at rest R (in the absence of external magnetic fields), and are designed to undergo in pairs one and the same variation in the presence of an external magnetic field H (the pairs are formed by the elements facing in diagonal in the bridge, namely, a first pair is formed by the magnetoresistive elements 2a and 2c, and a second pair by the magnetoresistive elements 2b and 2d).

The Wheatstone bridge has a first input terminal $In_1$, connected to the positive pole of a supply source for supplying a supply voltage $V_s$, and a second input terminal $In_2$, connected to the negative pole of the supply source (for example, coinciding with a ground terminal of the circuit). The Wheatstone bridge moreover has a first output terminal $Out_1$ and a second output terminal $Out_2$, present across which is the unbalancing signal of the Wheatstone bridge (i.e., the voltage variation $\Delta V$), which is a function of the characteristics of the external magnetic field H (and includes the offset component $V_{off}$).

The AMR magnetic sensor 2 further comprises a set/reset strap 3 (represented schematically in FIG. 2 as a resistor), arranged so as to be magnetically coupled to the magnetoresistive elements 2a-2d and electrically connected to a current generator 4, which is designed to supply a set or reset current $I_{sr}$ to the set/reset strap 3; in a known way, the set/reset strap 3 is integrated in the AMR magnetic sensor 2.

The reading circuit 1 comprises a reading stage 5 (shown schematically in FIG. 2), electrically coupled to the output of the AMR magnetic sensor 2 and including, in this embodiment, an instrumentation amplifier having a non-inverting input 5a, an inverting input 5b, and at least one first output 5c (the output may possibly be of a differential type, in a way here not illustrated), on which the output signal Vout is present, the value of which is a function of the external magnetic field H to be determined. The output signal Vout, in a way here not shown, can then be supplied to an external electronic unit, which can carry out further processing operations as a function of the same signal.

The reading circuit 1 further comprises an offset-compensation stage 6, which is connected to the output of the reading stage 5 and receives the output signal Vout, and is configured so as to determine, and then compensate, the value of the offset intrinsic to the structure of the AMR magnetic sensor 2.

As illustrated previously, the offset-compensation stage 6 is configured so as to compute the sum of at least two samples of the output signal Vout supplied by the reading stage 5, $Vout_{set}$ and $Vout_{reset}$, obtained following application of a set pulse and a reset pulse, respectively, to the set/reset strap 3 (via the current generator 4). The offset-compensation stage 6 can be a dedicated circuit of an analog type, or, alternatively, can be constituted by a digital block; in this case, each sample acquired is converted into digital format via an analog-to-digital (ADC) converter, here not shown, and the samples acquired are digitally added to one another.

The offset-compensation stage 6 thus generates at output, as a function of the value of the offset signal $Vout_{off}$ thus determined, at least one first compensation quantity COMP1, of an appropriate value, which is fed back at input to the reading stage 5 (hence providing a feedback path, external to the AMR magnetic sensor 2). In particular, in the embodiment illustrated in FIG. 2, the offset-compensation stage 6 also generates a second compensation quantity COMP2, which is also fed back at input to the reading stage 5.

The first compensation quantity COMP1 is sent to the non-inverting input 5a of the reading stage 5, via a first combination block 8a (for example, schematically represented as a "adder with sign" block), whilst the second compensation quantity COMP2 is fed back to the inverting input 5b of the same reading stage 5, via a second combination block 8b (for example, also schematically represented as a "adder with sign" block).

It should be noted that the first and second compensation quantities COMP1, COMP2 can, for example, be analog voltage or current signals, as likewise the combination blocks 8a, 8b, of an analog type, can operate in voltage or in current. In addition, the combination blocks 8a, 8b can be connected to the input of the reading stage 5 directly or else via the interposition of one or more electronic components.

As illustrated in FIG. 2, the first combination block 8a has: a positive input, connected to the second output terminal $Out_2$ of the Wheatstone bridge; a negative input, receiving the first compensation quantity COMP1 from the offset-compensation stage 6; and an output, connected to the non-inverting input 5a of the instrumentation amplifier of the reading stage 5. Furthermore, the second adder block 8b has: a positive input, connected to the first output terminal $Out_1$ of the Wheatstone bridge; a negative input, receiving the second compensation quantity COMP2 generated by the offset-compensation stage 6; and an output, connected to the inverting input 5b of the instrumentation amplifier of the reading stage 5.

The first, and possibly the second, compensation quantities COMP1, COMP2 are thus combined appropriately with the signal supplied by the AMR magnetic sensor 2 (i.e., the voltage variation $\Delta V$) to generate a compensated signal $V_{comp}$ at input to the reading stage 5, such as to compensate the effects of the offset of the same AMR magnetic sensor 2. The compensated signal $V_{comp}$ is processed by the reading stage 5 (in a per-se known manner), and is such that an output signal Vout without offset is supplied, and as not to cause saturation of the same reading stage 5.

In general, one aspect of the present disclosure hence envisages determining the value of the offset signal $Vout_{off}$ superimposed on the useful signal at output from the AMR magnetic sensor 2, and then exploiting this information for applying a corrective factor to the signal present at input to the reading stage 5 so as to carry out an offset compensation directly at input to the reading stage 5 and hence at input to the reading chain associated to the sensor, the compensation being carried out as a function of the determined offset value. An appropriate quantity obtained as a function of the determined offset signal $Vout_{off}$ can be fed back at input to the reading chain, and for example subtracted from the signal at output from the Wheatstone bridge of the AMR magnetic sensor 2.

Figure 3:
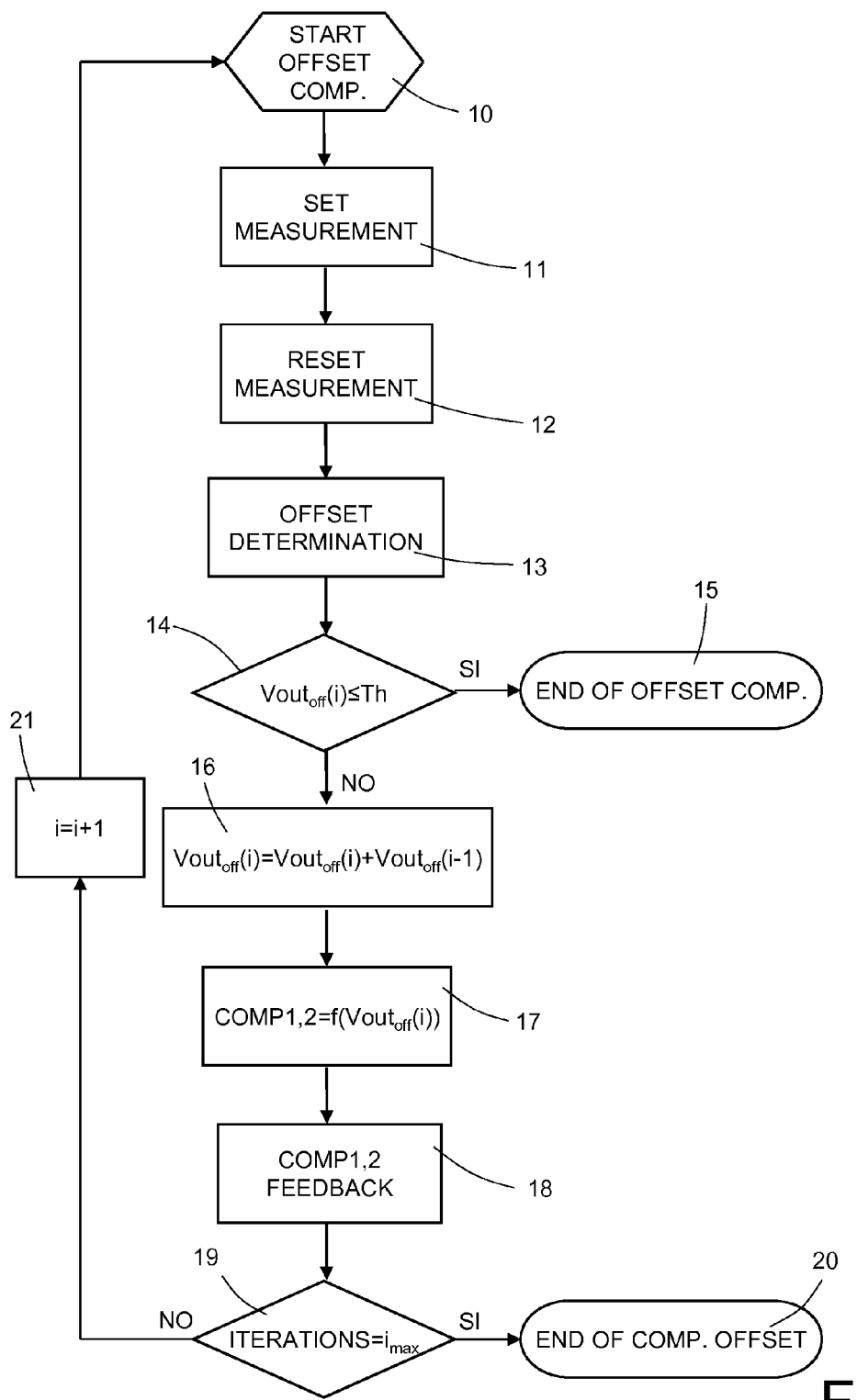
FIG. 3 is a flowchart regarding operations envisaged by a reading method implemented in the reading circuit of FIG. 2, according to one embodiment of the present disclosure.

As illustrated in FIG. 3, the offset-compensation algorithm of the AMR magnetic sensor 2 hence envisages the following operations, which are carried out within the offset-compensation stage 6, by means of analog and/or digital circuit elements, in particular, digital processing units (for example, of the microprocessor type).

In an initial step of the algorithm (step 10), the operations of offset adjustment and compensation are started. Starting of these operations can, for example, occur following upon a command imparted by a user, following upon a command received from an external electronic unit, or else following upon switching-on of the device incorporating the AMR magnetic sensor 2, or again whenever an external magnetic field is to be detected (according to the specific application and/or the requirements of the user).

Next (step 11), a set pulse is applied in the AMR magnetic sensor 2, via the set/reset strap 3 integrated in the sensor itself; the set pulse is such as to orient the magnetic dipoles of the magnetoresistive elements 2a-2d of the sensor in a first direction, and a first measurement of the output signal Vout supplied by the reading stage 5 coupled to the AMR magnetic sensor 2 is carried out; in this way the first sample $Vout_{set}(i)$ of the output signal is acquired.

It should be noted in particular, that, in one embodiment, the offset-compensation algorithm is of an iterative type; i.e., it envisages in general a series of successive iterations to obtain calibration of the offset at output. In fact, the non-calibrated offset, initially present at input to the reading stage 5, can cause saturation thereof and hence the difficulty of carrying out an accurate calibration in a single step. The aforesaid first sample $Vout_{set}(i)$ of the output signal is hence acquired in step i of the iterative algorithm (where initially i=1) and conveniently stored. According to one aspect of the disclosure, a maximum value for the index i, $i_{max}$, is moreover fixed, i.e., a maximum number of steps of the iterative algorithm (for example equal to 8), so as to prevent an infinite number of iteration cycles.

Next (step 12), via the set/reset strap integrated in the sensor, a reset pulse is applied to the AMR magnetic sensor 2, such as to orient the magnetic dipoles of the magnetoresistive elements of the sensor in a second direction, opposite to the first direction, and a second measurement of the output signal Vout supplied by the reading stage 5 coupled to the AMR magnetic sensor 2 is carried out; in this way, the second sample $Vout_{reset}(i)$ of the output signal Vout is acquired (the index i again indicates the current step of the iterative algorithm).

Then (step 13), the value of the offset signal $Vout_{off}(i)$ superimposed on the useful signal in the output signal Vout (as previously discussed in detail) is obtained by applying the expression:

$$Vout_{off}(i)=(Vout_{set}(i)+Vout_{reset}(i))/2.$$

At this point (step 14), the algorithm envisages verifying whether the value of the offset signal $Vout_{off}(i)$ previously determined (in step 13) is, or is not, lower than a given threshold Th (in case, equal to 0), i.e., if correct compensation of the offset signal at output has occurred. It should be noted that the value of the threshold Th depends upon the type of application and upon the level of offset tolerable on the output, and moreover upon the possible quantization of the signals involved.

If the value of the offset signal $Vout_{off}(i)$ is lower than the threshold Th, the algorithm proceeds to step 15, where the operations of offset compensation are stopped. For example, a signal may be then issued to the user indicating that the output signal Vout is offset-compensated, or else the output signal Vout (now corresponding to just the useful signal) can be at this point sent to an external electronic unit for subsequent processing (in a per-se known manner).

Instead, the fact that, at step 14, the value of the offset signal $Vout_{off}(i)$ is higher than the threshold implies the need to modify the value of the compensation quantities COMP1, COMP2 fed back at input to the reading stage 5, for example, by incrementing the value of the compensation quantities COMP1, COMP2 for the next step (i+1) of the iterative algorithm (note that the algorithm can be applied also in the presence of a single compensation quantity, for example the first compensation quantity COMP1).

The algorithm then proceeds with step 16, following upon step 14, which envisages updating the current value of the offset signal $Vout_{off}(i)$ by incrementing it with the value of the offset signal obtained at the previous step of the iterative process $Vout_{off}(i-1)$ (this value being hence previously conveniently stored), namely, by applying the following expression:

$$Vout_{off}(i)=Vout_{off}(i)+Vout_{off}(i-1).$$

Then (step 17), as a function of the offset value $Vout_{off}(i)$ thus modified, the new value of the compensation quantities COMP1, COMP2 that are to be sent at input to the reading stage 5, in order to obtain the compensation of the offset signal $Vout_{off}$ in the output signal Vout, is determined. For example, the value of the compensation quantities COMP1, COMP2 can vary according to a linear function with the value of the offset signal $Vout_{off}(i)$; alternatively, a mapping relation between the value of the compensation quantities COMP1, COMP2 and the value of the offset signal $\text{Vout}_{off}(i)$ can, for example, be provided.

In either case, the compensation quantities COMP1, COMP2 thus determined are then sent (step 18), at input to the reading stage 5 by means of the feedback path, so as to be combined with the signal at output from the Wheatstone bridge of the AMR magnetic sensor 2.

Then (step 19), a check is made to verify whether the number of iterations, designated by the index i, has reached the maximum number $i_{max}$. In the case where $i=i_{max}$, the algorithm proceeds to step 20, which again indicates stopping of the operations of offset compensation. In this case, a message can be sent for the user indicating that the operations of offset compensation have been unsuccessful. Instead, if it is found that the number of iterations has not yet reached the maximum number $i_{max}$, the index i is incremented (step 21), and the flow returns to the initial step 10 of the algorithm, for execution of a new iteration of the iterative algorithm.

Figure 4:
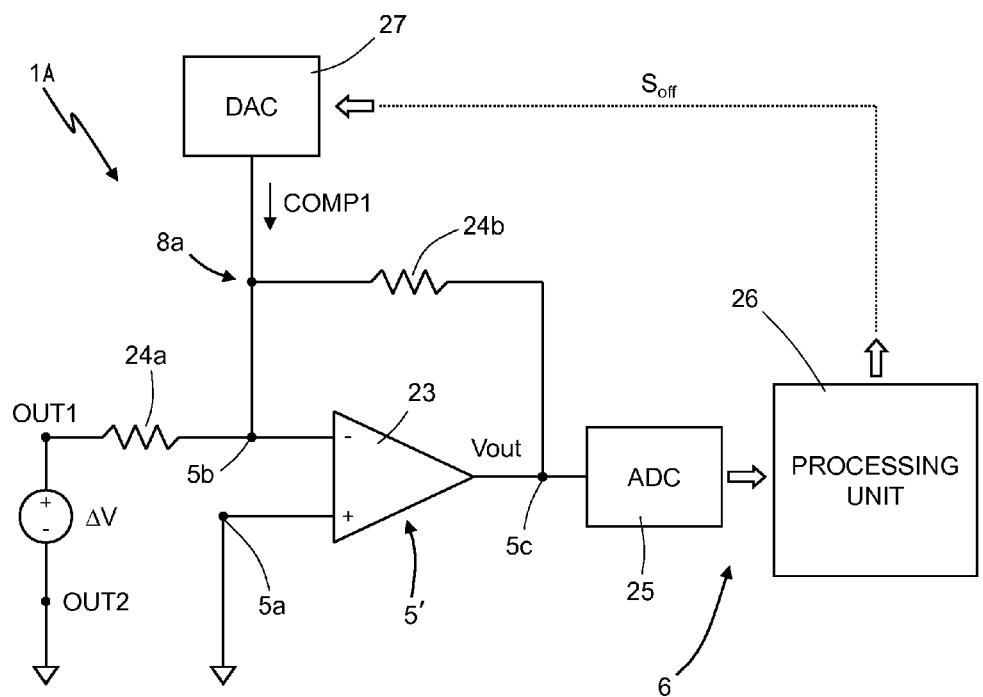
FIGS. 4 and 5 show respective embodiments of the reading circuit of FIG. 2.

FIG. 4 shows, by way of non-limiting example, a reading circuit 1A according to one embodiment of the reading circuit 1, which envisages the use of just the first compensation quantity COMP1, referred in this case to the inverting input 5b of the instrumentation amplifier, here designated by 23, of a reading stage 5' (the non-inverting input 5a of the instrumentation amplifier 23, as likewise the second output terminal $\text{Out}_2$ of the Wheatstone bridge of the AMR magnetic sensor 2, are set to a reference voltage, for example the ground of the circuit).

The first output terminal $\text{Out}_1$ of the Wheatstone bridge receives, instead, the bridge-unbalancing signal, i.e., the voltage variation $\Delta V$, which can be expressed as the sum of a useful signal contribution $V_{sig}$ and of an offset contribution $V_{off}$, the latter being due to the mismatches of the components inside the AMR magnetic sensor 2.

The instrumentation amplifier 23 has a resistive gain network connected to the inverting input 5b and constituted by: a first gain resistor 24a, connected between the inverting input 5b of the instrumentation amplifier 23 and the first output terminal $\text{Out}_1$ of the Wheatstone bridge of the AMR magnetic sensor 2; and a second gain resistor 24b, connected between the inverting input 5b and the single output 5c of the instrumentation amplifier 23.

The offset-compensation stage 6 (which is of a digital type, in this embodiment) comprises an ADC 25, which has its input connected to the output 5c of the instrumentation amplifier 23, and which is designed to convert from analog to digital the output signal Vout supplied by the same instrumentation amplifier 23 (for example, the ADC 25 is an M-bit converter, with M, for example, equal to twelve); and a processing unit 26, which is connected to the output of the ADC 25 and is designed to implement, by means of an appropriate control logic, the steps of the algorithm described previously with reference to FIG. 3.

In particular, the processing unit 26 determines the value of the offset signal $\text{Vout}_{off}$ present at output from the instrumentation amplifier 23 and generates, as a function of this value, a control signal $S_{off}$, of a digital type (for instance, having N bits, with N for example equal to eight).

The compensation stage 6 further comprises a digital-to-analog converter (DAC) 27, which receives at input the control signal $S_{off}$ and generates at output an analog current signal (that varies as a function of the value of the control signal $S_{off}$), which corresponds in this case to the first compensation quantity COMP1; the DAC 27 hence acts as generator of a current of selectable value.

The first compensation quantity COMP1 is fed back at input to the reading stage 5', in particular, to the inverting input 5b of the instrumentation amplifier 23, where it combines with the current circulating in the first gain resistor 24a (note that the first combination block 8a performs in this case a summation of currents).

It can be immediately verified that the output signal Vout at the output 5c of the instrumentation amplifier 23 (in this case a voltage signal) is given by the following expression:

$$Vout = -(V_{sig} + V_{off}) \cdot \frac{R_2}{R_1} - COMP1 \cdot R_2$$

where $R_2$ is the value of resistance of the second gain resistor 24b, and $R_1$ is the value of resistance of the first gain resistor 24a.

Through the variation of the compensation quantity COMP1 (on the basis of the offset-compensation algorithm described previously) it is hence possible to exploit the term $COMP1 \cdot R_2$ of the aforesaid expression to compensate (and in particular, reduce below the threshold Th) the offset signal $\text{Vout}_{off}$ at output, here corresponding substantially to the following term of the above expression:

$$V_{off} \cdot \frac{R_2}{R_1}.$$

Figure 5:
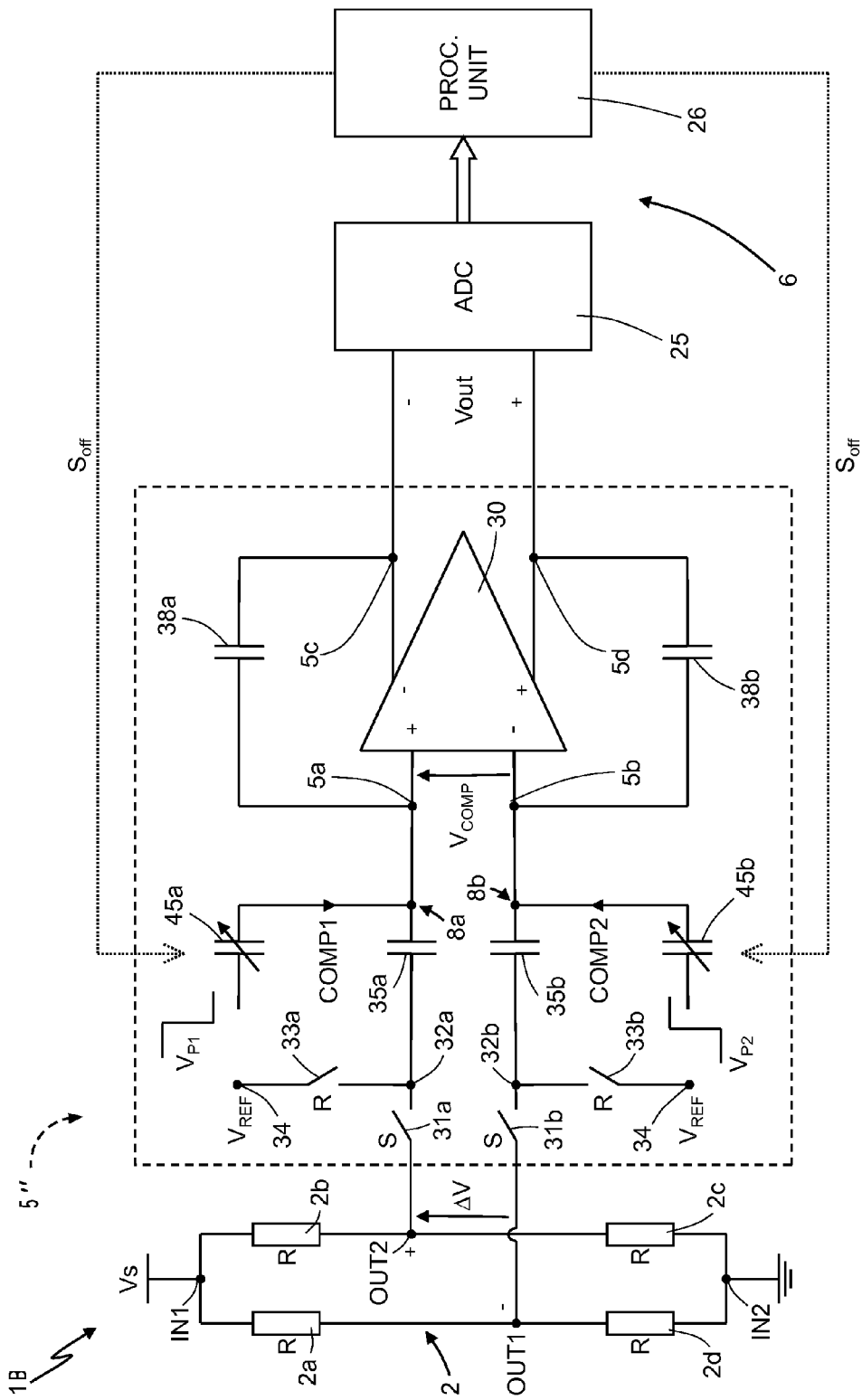

FIG. 5 shows, again by way of non-limiting example, a reading circuit 1B according to one embodiment of the reading circuit 1, in which a capacitive gain network is exploited associated with the instrumentation amplifier, here designated by 30, of a reading stage 5".

In this case, the instrumentation amplifier 30 is of a "fully differential" type; i.e., it has differential inputs (non-inverting input 5a and inverting input 5b) and differential outputs (non-inverting output 5c and inverting output 5d).

The reading stage 5" further comprises two substantially identical circuit branches, connected to the non-inverting input 5a and to the inverting input 5b, respectively, of the instrumentation amplifier 30.

Each circuit branch comprises: a first switch 31a, 31b (note that the letter a indicates one circuit branch and the letter b indicates the other), which is set between a respective output terminal $\text{Out}_2$, $\text{Out}_1$ of the Wheatstone bridge of the AMR magnetic sensor 2 and an intermediate node 32a, 32b and is controlled by a first logic signal S; a second switch 33a, 33b, which is set between the intermediate node 32a, 32b and a reference input 34 that receives a reference voltage $V_{REF}$, the value of which is equal to half the supply voltage $V_s$ of the Wheatstone bridge, and is controlled by a second logic signal R; a first gain capacitor 35a, 35b, which is connected between the intermediate node 32a, 32b and a respective input (non-inverting input 5a or inverting input 5b, according to the circuit branch considered) of the instrumentation amplifier 30; and a second gain capacitor 38a, 38b, which is connected between the aforesaid respective input and a respective output (inverting output 5c or non-inverting output 5d, according to the circuit branch considered) of the instrumentation amplifier 30.

The offset-compensation stage 6 (of a digital type, also in this embodiment) once again comprises: the ADC 25, which has inputs connected to the outputs 5c, 5d of the instrumentation amplifier 30, and is designed to convert from analog to digital the output signal Vout supplied by the instrumentation amplifier 30; and the processing unit 26, which is connected to the output of the ADC 25 and is designed to determine the value of the offset signal Vout$_{off}$ present at output from the instrumentation amplifier 30 and generate, as a function of this value, the control signal S$_{off}$, of a digital type.

The offset-compensation stage 6 further comprises a first trimmable-capacitor unit 45a and a second trimmable-capacitor unit 45b (which are also referred to as "captrim units"), which are of a digital type. Each captrim unit 45a, 45b has: a first terminal and a second terminal, between which it supplies a capacitance of a value that can be selectably varied; and a control terminal, on which it receives the control signal S$_{off}$, which determines the value of the aforesaid variable capacitance. The first and second captrim units 45a, 45b are designed to generate, as a function of the respective variable capacitance, the first and second compensation quantities COMP1, COMP2, respectively, in this case constituted by variations of a charge injected at a respective input of the instrumentation amplifier 30 (as described more fully hereinafter).

In greater detail, the first terminal of each captrim unit 45a, 45b is connected to a respective input (non-inverting input 5a or inverting input 5b, according to the circuit branch considered) of the instrumentation amplifier 30; the second terminal receives a stimulus signal, for example in the form of a voltage step of a pre-set value. The first captrim unit 45a receives on its second terminal a first stimulus signal V$_{p1}$, whilst the second captrim unit 45b receives on its second terminal a second stimulus signal V$_{p2}$, of a value "negated" (opposite) with respect to that of the first stimulus signal V$_{p1}$; in particular, the first stimulus signal V$_{p1}$ is an analog voltage signal that can vary between the supply voltage V$_s$ and the reference voltage V$_{REF}$, whilst the second stimulus signal V$_{p2}$, which is also an analog voltage signal, can vary between 0 and reference voltage V$_{REF}$.

Figure 6:
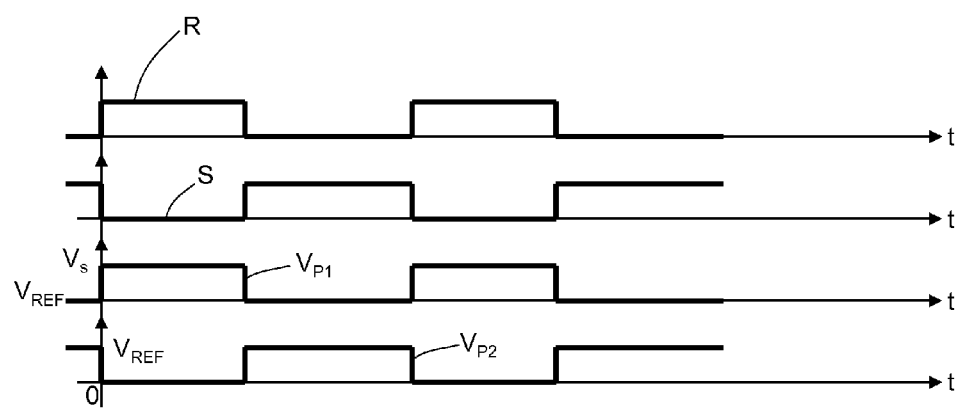
FIG. 6 shows a timing plot of control signals in the embodiment of the reading circuit of FIG. 5.

FIG. 6 shows a timing plot of the signals in the reading circuit 1, and in particular, of the first and second control signals S, R, and of the first and second stimulus signals V$_{p1}$, V$_{p2}$.

In use (note that reference will be made to a first circuit branch, but altogether similar considerations apply to the second circuit branch), during a discharge step, the first control signal S has a low logic value (thus opening the first switch 31a), whilst the second control signal R has a high logic value (thus closing the second switch 33a), in this way determining a condition of discharge of the first gain capacitor 35a and of the first captrim unit 45a (in so far as the voltage across them is zero, given that the non-inverting input 5a of the instrumentation amplifier 23 is at the voltage V$_{REF}$).

Next, during a reading step in which the first control signal S has a high logic value (thus closing the first switch 31a), whereas the second control signal R has a low logic value (thus opening the second switch 33a), the first gain capacitor 35a is charged to the value of the voltage present on the first output terminal Out$_1$ of the Wheatstone bridge of the AMR magnetic sensor 2, i.e., to the voltage ΔV/2=(V$_{sig}$/2+V$_{off}$/2). Consequently, a first charge quantity ΔQ1 charges the second gain capacitor 38a, as a result of the virtual ground at input to the instrumentation amplifier 30, given by $$\Delta Q1 = C1 \cdot (V_{sig}/2 + V_{off}/2)$$

where C1 is the value of capacitance of the first gain capacitor 35a.

Simultaneously, the first captrim unit 45a discharges by a voltage difference equal to V$_{REF}$/2 (given that the non-inverting input 5a of the instrumentation amplifier 30 is at the voltage V$_{REF}$/2). Consequently, a second charge quantity ΔQ2 charges the second gain capacitor 38a, again as a result of the virtual ground at input to the instrumentation amplifier 30, given by $$\Delta Q2 = CA \cdot (-V_{REF}/2)$$

where CA is the value of variable capacitance of the first captrim unit 45a.

It should be noted, in particular, that the second charge quantity ΔQ2 represents in this case the first compensation quantity COMP1 that is fed back at input to the reading stage 5″ to provide the offset compensation (the feedback path comprising in this case a combination block 8a, for combination of charge quantities, which is connected to the non-inverting input 5a of the instrumentation amplifier 30).

As a result of the aforesaid first and second charge quantities ΔQ1 and ΔQ2, the second gain capacitor 38a determines, by being charged, an output voltage Vout given by the following expression:

$$Vout = -C1/C2 \cdot (V_{sig}/2 + V_{off}/2) + CA/C2 \cdot (V_{REF}/2)$$

where C2 is the value of capacitance of the second gain capacitor 38a.

Through the variation of the compensation quantity COMP1 (on the basis the offset-compensation algorithm previously described), in this case constituted by the second charge quantity ΔQ2 (or, equivalently by the value of variable capacitance CA of the first captrim unit 45a), it is hence possible to exploit the term CA/C2·(V$_{REF}$/2) of the aforesaid expression to compensate (and in particular, reduce below the threshold Th, and, in case, eliminate) the offset signal Vout$_{off}$ at output, here substantially corresponding to the following term of the above expression: C1/C2· (V$_{off}$/2).

In other words, as a function of the value of the first and second compensation signals COMP1, COMP2, the value of capacitance provided by the captrim unit 45a, 45b varies, and hence the contribution of injection of charge in the respective non-inverting input 5a or inverting input 5b of the instrumentation amplifier 30 varies; in this way, the signal that is combined to the signal of voltage variation ΔV at output from the Wheatstone bridge moreover varies so as to implement the effect of offset compensation on the output signal Vout (according to the algorithm described previously).

Figure 7:
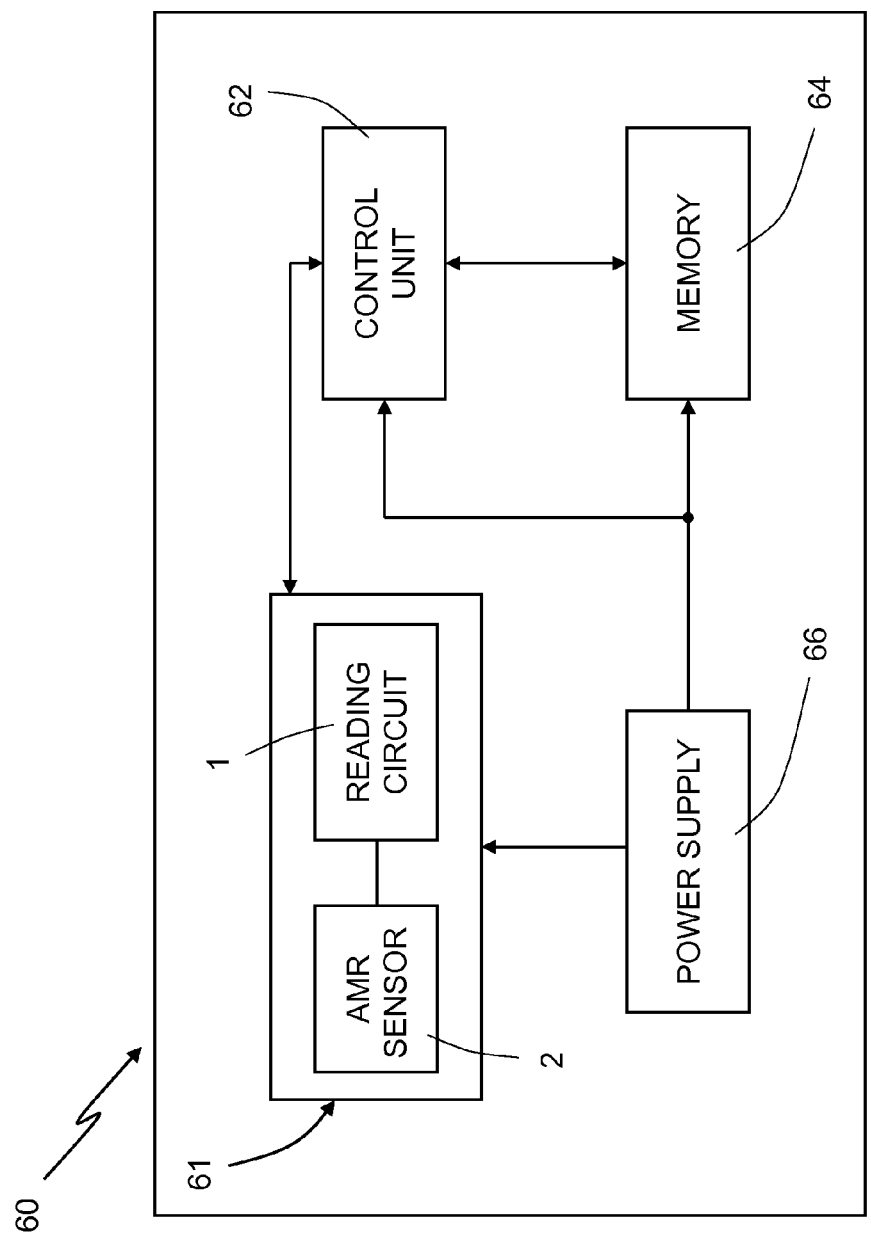
FIG. 7 shows a simplified block diagram of an electronic device including the reading circuit and the AMR magnetic sensor of FIG. 2.

FIG. 7 is a schematic illustration of an electronic device 60, in which the reading circuit 1, together with the AMR magnetic sensor 2, finds application, for example, for the production of a compass or a magnetometer.

Advantageously, the AMR magnetic sensor 2 and the corresponding reading circuit 1 can be obtained, with semiconductor micromachining techniques, within a single chip 61. In particular, the reading circuit 1 can be provided as an ASIC (Application Specific Integrated Circuit) in a first silicon die, and the AMR magnetic sensor 2 can be provided in a second die, housed, together with the first die, in one and the same package of the chip 61.

The electronic device 60 further comprises a control unit 62 using a microcontroller (or microprocessor, or similar computation and processing instrument), connected to the reading circuit 1, in particular, for controlling the operations of the reading circuit (and in particular, executing, when needed, the offset-compensation procedure), and for acquiring and processing the (analog or digital) output signal Vout supplied at output from the reading circuit 1, without the offset contribution. The electronic device 60 further comprises a memory 64 (optional), and a supply source 66, connected to the reading circuit 1, to the magnetic-field sensor 2, to the control unit 62, and to the memory 64, for providing the power for their operation; the supply source 66 can comprise, for example, a battery.

In a way not illustrated, the electronic device 60 can comprise further AMR magnetic sensors 2 and corresponding reading circuits 1, in order to enable detection along a number of axes of measurement, for example to provide a triaxial system of detection of external magnetic fields directed in respective directions of a set of three orthogonal axes x, y, z. In a known way, three magnetic-field sensors are sufficient to identify three spatial components of an external magnetic field detected, uniquely identifying the direction thereof. In this case, the electronic device 60 can further comprise a position-detection system, for example including an accelerometer, configured for detecting the orientation of the electronic device 60 with respect to the Earth's surface.

The advantages of the reading circuit and of the reading method according to the present disclosure emerge clearly from the foregoing description.

In particular, it is possible to obtain compensation of the offset present at output from an AMR magnetic sensor, without resorting to a shielded environment and to complex operations of calibration, thus reducing the costs of the reading operations. Furthermore, the operations of compensation can be carried out also during the normal reading operations of the sensor, without increasing the power consumption.

In general, the operation of compensation proves more accurate, in so far as situations of saturation of the reading stage (or front-end) are prevented.

The compensation circuit is advantageously provided coupled to the AMR magnetic sensor (for example, in one and the same package), in such a way as to provide the user with the possibility of compensating the offset as desired. For example, the user can decide to start the operations of compensation upon switching-on of the electronic device incorporating the sensor, upon execution of each measurement, or else whenever variations of temperature or of other external conditions might have caused a modification in the offset value and hence in the accuracy of the measurement.

Advantageously, the offset compensation is carried out at the ASIC level (i.e., in the integrated circuit associated to the magnetic sensor in the package), without any further processing operations being required by an external electronic unit.

The compensation procedure described, once started, can moreover be carried out in an altogether automatic way, without any intervention by the user and in a way altogether transparent to the same user.

Finally, it is clear that modifications and variations may be made to what has been described and illustrated herein, without thereby departing from the scope of the present disclosure.

In particular, it is evident that the circuit implementation of the reading stage 5, as well as the feedback path envisaged for offset compensation, can vary with respect to what described and illustrated herein.

Furthermore, the compensation algorithm can differ from the one described and illustrated; for example, the algorithm can envisage the use of a dichotomic technique (of a known type) for identifying iteratively the appropriate value to be assigned to the compensation quantity for compensating the offset at output.

The reading method and the reading circuit according to the present disclosure may moreover be used to compensate the offset of further magnetic-field sensors, for example comprising magnetoresistive elements (or in general at least one magnetoresistive element) in a configuration that is different from the one described and illustrated herein.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   reading, using a reading circuit, a magnetic-field sensor having a first magnetoresistive element, the reading including:
      generating an output signal, indicative of a magnetic field, as a function of a detection signal supplied by said magnetic-field sensor, using a reading stage of the reading circuit, which receives said detection signal,
      determining a value of an offset signal present in said output signal;
      generating a compensation quantity as a function of the value of said offset signal;
      feeding back said compensation quantity to an input of said reading stage, the compensation quantity providing feedback to the reading stage; and
      applying a corrective factor as a function of said compensation quantity, the applying the corrective factor adjusting the detection signal to reduce the value of said offset signal in the output signal.

2. The method according to claim 1, wherein said feeding back comprises combining said compensation quantity with said detection signal and providing a compensated signal such as to reduce the value of said offset signal at output from said reading stage below a threshold.

3. The method according to claim 2, wherein generating the compensation quantity comprises implementing an iterative algorithm that includes at each iteration:
   determining a current value of said offset signal;
   if said current value is higher than said threshold, updating the current value of said offset signal as a function of a previous value of said offset signal; and
   generating said compensation quantity as a function of the current value of said offset signal.

4. The method according to claim 1, wherein determining the value of an offset signal comprises:
   orienting a magnetization moment of said first magnetoresistive element in a first direction with a first sense;
   acquiring a first value of said output signal, with the magnetization moment of said first magnetoresistive element oriented in said first sense;
   orienting the magnetization moment of said first magnetoresistive element in said first direction with a second sense, opposite to said first sense;
   acquiring a second value of said output signal, with the magnetization moment of said first magnetoresistive element oriented in said second sense; and
   jointly processing said first value and second value of said output signal to determine the value of said offset signal.

5. The method according to claim 4, wherein said jointly processing comprises determining said value of said offset signal using the following expression:

$$Vout_{off} = (Vout_{set} + Vout_{reset})/2$$

where $Vout_{off}$ is the value of said offset signal, and $Vout_{set}$ and $Vout_{reset}$ are said first and second values, respectively, of said output signal.

6. The method according to claim 1, wherein said magnetic-field sensor is an AMR magnetic sensor provided with further magnetoresistive elements arranged, with said first magnetoresistive element, in a bridge detection structure; wherein said detection signal is an unbalancing signal of said bridge detection structure.

7. The method of claim 1, comprising:
determining the value of the offset signal based on at least two values of the output signal.

8. A reading circuit, comprising:
reading circuitry, which, in operation, receives a detection signal of a magnetic-field sensor and generates an output signal indicative of a magnetic field; and
compensation circuitry coupled to the reading circuitry, and which, in operation, provides feedback to the reading circuit by:
determining a value of an offset signal present in said output signal based on at least a value of the output signal at a first instant and a value of the output signal at a second instant; and
generating a compensation signal as a function of the value of said offset signal, wherein the reading circuitry, in operation, adjusts the detection signal based on the compensation signal and generates a current value of the output signal based on the adjusted detection signal, the adjusting the detection signal based on the compensation signal reducing an offset contribution in the current value of the output signal.

9. The circuit according to claim 8, wherein said reading circuitry, in operation, combines the compensation signal and said detection signal to produce the adjusted detection signal.

10. The circuit according to claim 9, wherein said compensation circuitry, in operation, determines the value of an offset signal present in said output signal by implementing an iterative algorithm, wherein at least one iteration includes:
determining a current value of said offset signal present in said output signal;
comparing the current value to a threshold value; and
when said current value is higher than the threshold value, updating the current value of said offset signal as a function of a previous value of said offset signal.

11. The circuit according to claim 8, comprising a magnetization element configured to couple to a first magnetoresistive element of the magnetic field sensor and configured to orient a magnetization moment of said first magnetoresistive element in a first sense or in a second sense, opposite to one another, of a given direction; and wherein said compensation circuitry, in operation:
acquires at least a first value of said output signal, in the presence of said first sense of orientation of the magnetization moment of said first magnetoresistive element;
acquires at least a second value of said output signal, in the presence of said second sense of orientation of the magnetization moment of said first magnetoresistive element; and
determines the value of said offset signal based on said first value and said second value of said output signal.

12. The circuit according to claim 11, wherein said compensation circuitry, in operation, determines said value of said offset signal according to:

$$Vout_{off} = (Vout_{set} + Vout_{reset})/2,$$

where $Vout_{off}$ is the value of said offset signal, and $Vout_{set}$ and $Vout_{reset}$ are the first and second values, respectively, of said output signal.

13. The circuit according to claim 8, wherein said magnetic-field sensor is an AMR magnetic sensor provided with magnetoresistive elements arranged in a bridge detection structure and said detection signal is an unbalancing signal of said bridge detection structure.

14. The circuit according to claim 13, wherein:
said reading circuitry comprises:
an amplifier having an input configured to receive said detection signal; and
a resistive gain network coupled to said input and to an output of said amplifier; and
said compensation circuitry comprises a selectable current generator configured to generate the compensation signal.

15. The circuit according to claim 13, wherein:
said reading circuitry comprises:
an amplifier having an input configured to receive said detection signal; and
a capacitive gain network coupled to said input and to an output of said amplifier; and
said compensation circuitry comprises an adjustable capacitance configured to generate the compensation signal.

16. An electronic device, comprising:
a magnetic-field sensor having a first magnetoresistive element;
a reading circuit coupled to said magnetic-field sensor and including:
a reading stage configured to be coupled to said magnetic-field sensor to receive at input a detection signal and configured to generate an output signal, indicative of a magnetic field, as a function of said detection signal; and
a compensation stage coupled to an output of said reading stage and configured to: determine a value of an offset signal present in said output signal based on at least a value of the output signal at a first instant and a value of the output signal at a second instant, generate a compensation quantity as a function of the value of said offset signal, and provide said compensation quantity at input to said reading stage, the compensation quantity providing feedback to the reading stage, wherein the reading stage applies a corrective factor as a function of said compensation quantity, which adjusts the detection signal to reduce the value of said offset signal in the output signal; and
a control unit coupled to said reading circuit and configured to receive said output signal.

17. The device according to claim 16, wherein said reading stage is configured to produce a compensated signal by combining said compensation quantity and said detection signal, and use the compensated signal to reduce the value of said offset signal, at output from said reading stage below a threshold.

18. The device according to claim 17, wherein said compensation stage is configured to implement an iterative algorithm that includes at each iteration:
- determining a current value of said offset signal;
- if said current value is higher than said threshold, updating the current value of said offset signal as a function of a previous value of said offset signal; and
- generating said compensation quantity as a function of the current value of said offset signal.

19. The device according to claim 16, comprising a magnetization element configured to be coupled to said first magnetoresistive element and configured to orient a magnetization moment of said first magnetoresistive element in a first sense or in a second sense, opposite to one another, of a given direction; and wherein said compensation stage is configured to:
- acquire at least a first value of said output signal, in the presence of said first sense of orientation of the magnetization moment of said first magnetoresistive element;
- acquire at least a second value of said output signal, in the presence of said second sense of orientation of the magnetization moment of said first magnetoresistive element; and
- determine the value of said offset signal by jointly processing said first value and said second value of said output signal.

20. The device according to claim 19, wherein said compensation stage is configured to determine said value of said offset signal according to the following expression:

$$Vout_{off} = (Vout_{set} + Vout_{reset})/2,$$

where $Vout_{off}$ is the value of said offset signal, and $Vout_{set}$ and $Vout_{reset}$ are the first and second values, respectively, of said output signal.

21. The device according to claim 16, wherein said magnetic-field sensor is an AMR magnetic sensor provided with further magnetoresistive elements arranged, with said first magnetoresistive element, in a bridge detection structure; wherein said detection signal is an unbalancing signal of said bridge detection structure.

22. The device according to claim 21, wherein:
said reading stage comprises:
- an amplifier having an input configured to receive said detection signal; and
- a resistive gain network coupled to said input and to an output of said amplifier; and said compensation stage comprises a selectable current generator configured to generate a current of a value that varies in correspondence with said compensation quantity.

23. The device according to claim 21, wherein:
said reading stage comprises:
- an amplifier having an input configured to receive said detection signal; and
- a capacitive gain network coupled to said input and to an output of said amplifier; and said compensation stage comprises an adjustable capacitor unit configured to generate a charge quantity of a value that varies in correspondence with said compensation quantity.

24. A system, comprising:
a reading circuit, which, in operation, receives a magnetic-field detection signal and generates an output signal indicative of a magnetic field; and
compensation circuitry coupled to the reading circuit, which, in operation provides feedback to the reading circuit by:
- determining a value of an offset signal based on a value of the output signal at a first instant and a value of the output signal at a second instant; and
- generating a compensation signal as a function of the value of said offset signal, wherein the reading circuit, in operation:
  - adjusts the magnetic-field detection signal based on the compensation signal to reduce an offset contribution on the output signal; and
  - generates a current value of the output signal based on the adjusted magnetic-field detection signal.

25. The system of claim 24 wherein said compensation circuitry, in operation, determines the value of an offset signal present in said output signal by implementing an iterative algorithm, wherein at least one iteration includes:
- determining a current value of said offset signal present in said output signal;
- comparing the current value to a threshold value; and
- based on the comparison of the current value to the threshold value, updating the current value of said offset signal as a function of a previous value of said offset signal.

26. The system of claim 25 wherein the compensation circuitry, in operation, compares a number of iterations of the iterative algorithm to a threshold number, and, based on the comparison of the number of iterations to the threshold number, terminates the iterative algorithm.

27. The system of claim 24, comprising a magnetic-field sensor, which, in operation, generates the magnetic-field detection signal.

28. The system of claim 27, comprising a magnetization element configured to couple to a first magnetoresistive element of the magnetic-field sensor and to orient a magnetization moment of said first magnetoresistive element in a first sense or in a second sense, opposite to one another, wherein said compensation circuitry, in operation:
- acquires at least a first value of said output signal, in the presence of said first sense of orientation of the magnetization moment of said first magnetoresistive element;
- acquires at least a second value of said output signal, in the presence of said second sense of orientation of the magnetization moment of said first magnetoresistive element; and
- determines the value of said offset signal based on said first value and said second value of said output signal.

* * * * *